(12) United States Patent
Maurath et al.

(10) Patent No.: US 9,121,912 B2
(45) Date of Patent: Sep. 1, 2015

(54) LOADING STATE DETERMINER, LOAD ASSEMBLY, POWER SUPPLY CIRCUIT AND METHOD FOR DETERMINING A LOADING STATE OF AN ELECTRIC POWER SOURCE

(75) Inventors: Dominic Maurath, Villingen-Schwenningen (DE); Bernd Folkmer, Villingen-Schwenningen (DE)

(73) Assignee: Hahn-Schickard-Gesellschaft fuer angewandte Forschung e.V., Villingen-Schwenningen (DE)

( * ) Notice: Subject to any disclaimer, the term of this patent is extended or adjusted under 35 U.S.C. 154(b) by 726 days.

(21) Appl. No.: 13/481,449

(22) Filed: May 25, 2012

(65) Prior Publication Data

US 2012/0286805 A1 Nov. 15, 2012

Related U.S. Application Data

(63) Continuation of application No. PCT/EP2010/067763, filed on Nov. 18, 2010.

(30) Foreign Application Priority Data

Nov. 27, 2009 (DE) .......................... 10 2009 047 247

(51) Int. Cl.
*G01R 27/28* (2006.01)
*G01R 31/40* (2014.01)
(52) U.S. Cl.
CPC ..................................... *G01R 31/40* (2013.01)
(58) Field of Classification Search
CPC ....................................................... G01R 31/40
USPC ......................................... 324/649; 333/17.3
See application file for complete search history.

(56) References Cited

U.S. PATENT DOCUMENTS 3,489,915 A 1/1970 Engelhardt
4,649,334 A 3/1987 Nakajima
(Continued)

FOREIGN PATENT DOCUMENTS

DE 199 04 561 2/1999
DE 10 2007 059 349 12/2007
(Continued)

OTHER PUBLICATIONS

Lefeuvre et al: "Buck-boost converter for sensorless power optimization of piezoelectric energy harvester", published in: IEEE Trans. Power Electron, vol. 22, pp. 2018, Sep. 2007.
(Continued)

*Primary Examiner* — Benjamin M Baldridge
(74) *Attorney, Agent, or Firm* — Michael A. Glenn; Perkins Coie LLP

(57) ABSTRACT

A loading state determiner for determining a loading state of an electric power source including a source impedance includes a voltage drop determination circuit which is implemented to provide, based on a detection of an instantaneous current provided under load by the power source to a load, an electric quantity describing a voltage drop at a source impedance of the power source. Further, the loading state determiner includes an evaluation circuit which is implemented to obtain, based on electric quantity describing the voltage drop at the source impedance of the power source and an electric quantity describing a terminal voltage of the power source, a load state signal carrying information on an instantaneous relation between the terminal voltage of the power source and a no-load voltage of the power source.

13 Claims, 8 Drawing Sheets

(56) References Cited

U.S. PATENT DOCUMENTS

| | | | |
|---|---|---|---|
| 4,890,073 A * | 12/1989 | Flachenecker et al. | 331/55 |
| 5,867,011 A | 2/1999 | Jo et al. | |
| 6,046,594 A * | 4/2000 | Mavretic | 324/520 |
| 6,515,485 B1 * | 2/2003 | Bullock et al. | 324/601 |
| 6,737,831 B2 | 5/2004 | Champlin | |
| 6,844,739 B2 | 1/2005 | Kasai et al. | |
| 7,053,506 B2 | 5/2006 | Alonso et al. | |
| 7,105,982 B1 | 9/2006 | Hagood, IV et al. | |
| 7,557,540 B2 | 7/2009 | Kao et al. | |
| 2003/0102932 A1 * | 6/2003 | Lee et al. | 333/17.3 |
| 2006/0088655 A1 * | 4/2006 | Collins et al. | 427/8 |
| 2007/0035356 A1 * | 2/2007 | Ranta | 333/17.3 |
| 2007/0282561 A1 * | 12/2007 | Beckwith | 702/127 |
| 2008/0061901 A1 * | 3/2008 | Gilmore | 333/17.3 |
| 2009/0174496 A1 * | 7/2009 | Van Bezooijen | 333/17.3 |
| 2010/0013498 A1 * | 1/2010 | Olguin | 324/649 |
| 2011/0025348 A1 * | 2/2011 | Chetham et al. | 324/649 |
| 2011/0193568 A1 * | 8/2011 | Wang et al. | 324/649 |
| 2011/0227587 A1 * | 9/2011 | Nakanishi et al. | 324/649 |
| 2013/0002267 A1 * | 1/2013 | Kothandaraman et al. | 324/649 |
| 2013/0093435 A1 * | 4/2013 | Van Wyk et al. | 324/649 |
| 2015/0028891 A1 * | 1/2015 | Endo et al. | 324/649 |

FOREIGN PATENT DOCUMENTS

| | | |
|---|---|---|
| EP | 1 003 234 | 5/2000 |
| FR | 2 618 922 | 7/1987 |
| WO | WO 2007/118277 | 10/2007 |

OTHER PUBLICATIONS

Ottmann et al: "Optimized piezoelectric energy-harvesting circuit using step-down converter in discontinuous conduction mode", published in : IEEE Trans. Power Electron., vol. 18, pp. 696, Mar. 2003.

Peters et al: "A CMOS integrated voltage and power efficient AC/DC converter for energy harvesting applications", Journal of Micromechanics & Microengineering, Institute of Physics Publishing, Bristol, GB, Bd. 18, Nr. 10, Oct. 1, 2008, p. 104005, XP020144988, ISSN: 0960-1317.

* cited by examiner

LOADING STATE DETERMINER, LOAD ASSEMBLY, POWER SUPPLY CIRCUIT AND METHOD FOR DETERMINING A LOADING STATE OF AN ELECTRIC POWER SOURCE

CROSS-REFERENCE TO RELATED APPLICATIONS

This application is a continuation of copending International Application No. PCT/EP2010/067763, filed Nov. 18, 2010, which is incorporated herein by reference in its entirety, and additionally claims priority from German Application No. DE 102009047247.9, filed Nov. 27, 2009, which is also incorporated herein by reference in its entirety.

BACKGROUND OF THE INVENTION

Embodiments according to the invention relate to a loading state determiner for determining a loading state of an electric power source comprising an internal resistance. Further embodiments according to the invention relate to a load assembly. Further embodiments according to the invention relate to a power supply assembly. Further embodiments according to the invention relate to a method for determining a loading state of an electric power source comprising an internal resistance.

Generally, it can be said that embodiments according to the invention relate to an electronic interface for energy harvesters.

Electric generators are used in many cases for obtaining electric energy based on another form of energy, e.g., mechanical energy, a temperature gradient, chemically stored energy or radiation energy. For an optimum operation of generators, it is desirable to have load matching. This matching is desirable (or in some cases even necessitated) since the generated voltage of a generator (or generally: a power source) can only be tapped at its terminals (i.e., at the sources of generator, or generally the terminals of the power source) via its frequently large internal resistance (or generally source impedance). Typically, for achieving this matching or load matching, a circuit, e.g., a power converter or voltage converter is connected to the generator, which is to load the generator such that the same outputs maximum possible power due to optimum loading.

In the considered generators which are typical for energy harvesting, the load current across the internal resistance (or the source impedance) causes a voltage drop. Thus, the source voltage (e.g., the terminal voltage at the externally accessible terminals of the generator) is reduced. Only with a specific combination of load current and internal resistance (or source impedance) or at a specific terminal voltage, power output is at a maximum.

Load matching is generally achieved when the load impedance (i.e., the ratio between voltage and current at the load) has the value of the complex conjugate source impedance (impedance of the generator). Thus, the load matching is frequently referred to as impedance matching.

Thus, typically, load matching or impedance matching is combined with the fact that at this matched load, the terminal voltage of the generator corresponds to half its instantaneous no-load voltage or open-circuit voltage. Since generators are, in particular in energy-harvesting applications, generally excited by external events—for example vibrations and impacts—the time curve of the resulting no-load voltage is not known.

Considering this, different concepts have been developed for operating an electric generator as efficiently as possible. Here, the superior goal is mostly the operation of a source (e.g., a generator) at the optimum operating point or load point, such that maximum output power is available.

Many conventional systems try to achieve this by gradient-based control algorithms combined with a repeated or permanent power measurement. For details in this regard, reference is made, for example, to U.S. Pat. Nos. 5,867,011, 7,053,506 and U.S. Pat. No. 6,844,739, each describing a gradient method and power measurement. This power determination is performed by simultaneous current and voltage measurement, wherein the determined values are subsequently multiplied.

Other approaches try to maximize the output power via specific assumptions with a complex control algorithm. Details in this regard are described, for example in the publication "Optimized piezoelectric energy-harvesting circuit using step-down converter in discontinuous conduction mode" by G. K. Ottmann, H. F. Hofmann and G. A. Lesieutre (published in: IEEE Trans. Power Electron., vol. 18, pp. 696, March 2003) and in the publication "Buck-boost converter for sensorless power optimization of piezoelectric energy harvester," by E. Lefeuvre, D. Audigier and D. Guyomar published in: IEEE Trans. Power Electron, vol, 22, pp. 2018, September 2007).

However, these approaches are very complex, whereby in many cases their high internal power consumption has a negative effect.

Apart from this, there are several methods for indirect measurement of no-load voltage from other fields of application, such as battery technology:
1. Measurement in unloaded intervals (see, for example, U.S. Pat. No. 7,557,540 B2):
   The voltage is measured in phases where the generator (or the source) is unloaded.
   This takes place in loading intervals or at the beginning of the operation. Here, it is assumed that the no-load voltage of the generator does not change significantly. In summary, it can be said that in the concept according to U.S. Pat. No. 7,557,540 B1, measurement does not take place under load.
2. Auxiliary generator in permanent no-load operation for measuring the no-load voltage (cf. DE 199 04 561):
   In addition to the active or used loaded generator, a second generator is operated which is similar to the loaded generator. This second generator is operated in no-load operation, and a no-load voltage of the loaded generator is determined by voltage measurement. Thus, all in all, DE 199 04 561 describes the usage of an unloaded "auxiliary module".
3. Test measurements with different loads (see, for example, EP 100 3234 A1 and U.S. Pat. No. 6,737,831 B2):
   Known test loads are connected to the generator. By comparing the clamp voltages or terminal voltages, the current no-load voltage can be recalculated. Thus, EP 100 3234 A1 describes a test measurement with different test loads. U.S. Pat. No. 6,737,831 B2 describes current injection and voltage difference measurement.

Considering the conventional concepts for determining the no-load voltage of a generator, it is the object of the present invention to provide a concept for determining loading state or a no-load voltage of a power source that can be implemented with little effort and still provides meaningful information regarding the load state.

SUMMARY

According to an embodiment, a loading state determiner for determining a loading state of an electric power source having a known source impedance may have: a voltage drop determination circuit, which is implemented to provide, based on a detection of an instantaneous current provided under load by the power source to a load, an electric quantity describing a voltage drop at the known source impedance of the power source and being proportional to the instantaneous current; and an evaluation circuit, which is implemented to obtain, based on the electric quantity describing the voltage drop at the source impedance of the power source and an electric quantity proportional to a terminal voltage of the power source or to a rectified terminal voltage of the power source, a load state signal carrying information on an instantaneous relation between the terminal voltage of the power source and a no-load voltage of the power source, wherein the evaluation circuit is implemented to compare, for determining the information on the relation between the terminal voltage of the power source and the no-load voltage of the power source, the electric quantity describing the voltage drop at the source impedance of the power source with the electric quantity that is proportional to the terminal voltage of the power source or to the rectified terminal voltage of the power source; wherein the evaluation circuit is implemented to provide the load state signal such that the load state signal indicates whether the terminal voltage of the electric power source is at least approximately equal to the half of the no-load voltage of the electric power source or differs by more than a predetermined tolerance from the half of the no-load voltage, or wherein the evaluation circuit is implemented to provide the load state signal such that the load state signal indicates whether the terminal voltage is higher or lower than the half of a no-load voltage of the electric power source.

According to another embodiment, a load assembly may have: an inventive loading state determiner; an adjustable load circuit and; a load adjuster; wherein the voltage drop determination circuit of the loading state determiner is implemented to detect the instantaneous current provided by the power source to the adjustable load circuit; and wherein the load adjuster is implemented to adjust the load in dependence on the load state signal such that power matching exists between the power source and the adjustable load circuit.

According to another embodiment, a power supply assembly may have: an electric generator, which is implemented to act as electric power source and to provide a no-load voltage depending on a drive state, wherein the electric generator includes a source impedance, such that, in a loading case, a terminal voltage of the electric generator is lower than the no-load voltage; and an inventive load assembly; wherein the loading state determiner of the load assembly is implemented to provide, based on a detection of an instantaneous current provided by the electric generator to the adjustable load circuit, the electric quantity describing a voltage drop at a source impedance of the power source, such that the same describes a voltage drop at a source impedance of the electric generator.

According to another embodiment, a method for determining a loading state of an electric power source having a known source impedance may have the steps of: determining a quantity describing a voltage drop at the known source impedance of the power source, based on an instantaneous current provided under load by the power source to a load, such that the quantity describing the voltage drop at the known source impedance is proportional to the instantaneous current; and obtaining a load state signal carrying information on an instantaneous relation between the terminal voltage of the power source and the no-load voltage of the power source, based on the quantity describing the voltage drop at the internal resistance of the power source and a quantity describing the terminal voltage of the power source, wherein, for determining the information on the relation between the terminal voltage of the power source and the no-load voltage of the power source, the electric quantity describing the voltage drop at the source impedance of the power source is compared to the electric quantity describing the terminal voltage of the power source; and wherein the load state signal is provided such that the load state signal indicates whether the terminal voltage of the electric power source is at least approximately equal to a half of a no-load voltage of the electric power source or differs from the half of the no-load voltage by more than a predetermined tolerance, or wherein the load state signal is provided such that the load state signal indicates whether the terminal voltage is higher or lower than the half of a no-load voltage of the electric power source.

An embodiment according to the invention provides a loading state determiner for determining a loading state of an electric power source comprising a source impedance (for example an internal resistance). The loading state determiner includes a voltage drop determination circuit, which is implemented to provide, based on a detection of an instantaneous current provided under load by the power source to a load, an electric quantity describing a voltage drop at the source impedance (for example, the internal resistance) of the power source. Further, the loading state determiner includes an evaluation circuit, which is implemented to obtain, based on the electric quantity describing the voltage drop at the internal resistance of the power source and an electric quantity describing a terminal voltage of the power source, a load state signal carrying information on an instantaneous relation between the terminal voltage of the power source and a no-load voltage of the power source.

This embodiment according to the invention is based on the knowledge that it is possible to determine information on the loading state by using electric quantities that are determined at a common time and without changing the load state in between, by generating, based on a measurement of an instantaneous current provided to the load, an electric quantity describing the voltage drop at the internal resistance of the power source. The electric quantity can then be connected (for example compared) to an electric quantity describing the terminal voltage in order to obtain information on the instantaneous relation between the terminal voltage of the power source and the no-load voltage of the power source.

Otherwise, the inventive concept is easily realizable, in particular with a low number of parts, since it is not necessitated, according to the invention, to connect measurement quantities determined at different times to obtain information on the relation between the terminal voltage of the power source and the no-load voltage of the power source. Rather, when using the inventive concept, it is advantageous to evaluate electric quantities at a common time. This enables analog processing with little effort without necessitating complex and power-consuming analog memory members or a complex digital processing circuit.

Additionally, the inventive concept does not necessitate changing the load for performing a measurement of the no-load voltage or for determining the loading state, since, according to the invention, merely the instantaneous current currently provided to the load and the instantaneous terminal voltage have to be measured or processed for obtaining information on the load state. In particular, the inventive concept is therefore also particularly well suited for determining the load state in power sources whose no-load voltage changes permanently or at least very frequently.

Further advantages of the inventive concept will be explained in more detail below.

A further embodiment according to the invention provides a load assembly with a loading state determiner as described above. Further, the load assembly includes an adjustable load circuit and a load adjuster. The voltage drop determination circuit of the loading state determiner is implemented to detect the instantaneous current provided by the power source to the adjustable load circuit. The load adjuster is further implemented to adjust the load in dependence on the load state signal provided by the loading state determiner such that power matching exists between the power source and the adjustable load. In this way it can be achieved that a maximum possible power is provided by the power source to the load. In this way, an appropriate adjustment of the load can be securely obtained, such that the load impedance of the load assumes a complex conjugate value compared to the source impedance of the power source, or that the load impedance is equal to the source impedance of the power source in the case of a substantially real-valued source impedance of the power source. Thereby, it is obtained that the power available from the power source is output to the load in the best possible manner within unavoidable tolerances.

A further embodiment according to the present invention provides a power supply assembly with an electric generator, which is implemented to act as an electric power source to provide a no-load voltage depending on the drive state. The electric generator comprises a source impedance or an internal resistance, such that, in a loading case, a terminal voltage of the electric generator is lower than the no-load voltage of the electric generator. Further, the power supply assembly includes the above described load assembly, wherein the loading state determiner of the load assembly is implemented to provide, based on the detection of an instantaneous current provided by the electric generator to the adjustable load circuit, the electric quantity describing a voltage drop at the source impedance of the power source, such that the same describes a voltage drop at the source impedance of the electric generator.

A further embodiment according to the invention provides a method for determining a loading state of an electric power source including a source impedance, for example an internal resistance. The method describes determining a quantity describing a voltage drop at an internal resistance of the power source, based on the detection of an instantaneous current provided under load by the power source to the load. Further, the method comprises obtaining an information signal carrying information on an instantaneous relation between the terminal voltage of the power source and the no-load voltage of the power source, based on the quantity describing the voltage drop at the source impedance of the power source and an electric quantity describing the terminal voltage of the power source.

The respective method has the same advantages and effects as described above with regard to the inventive device.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
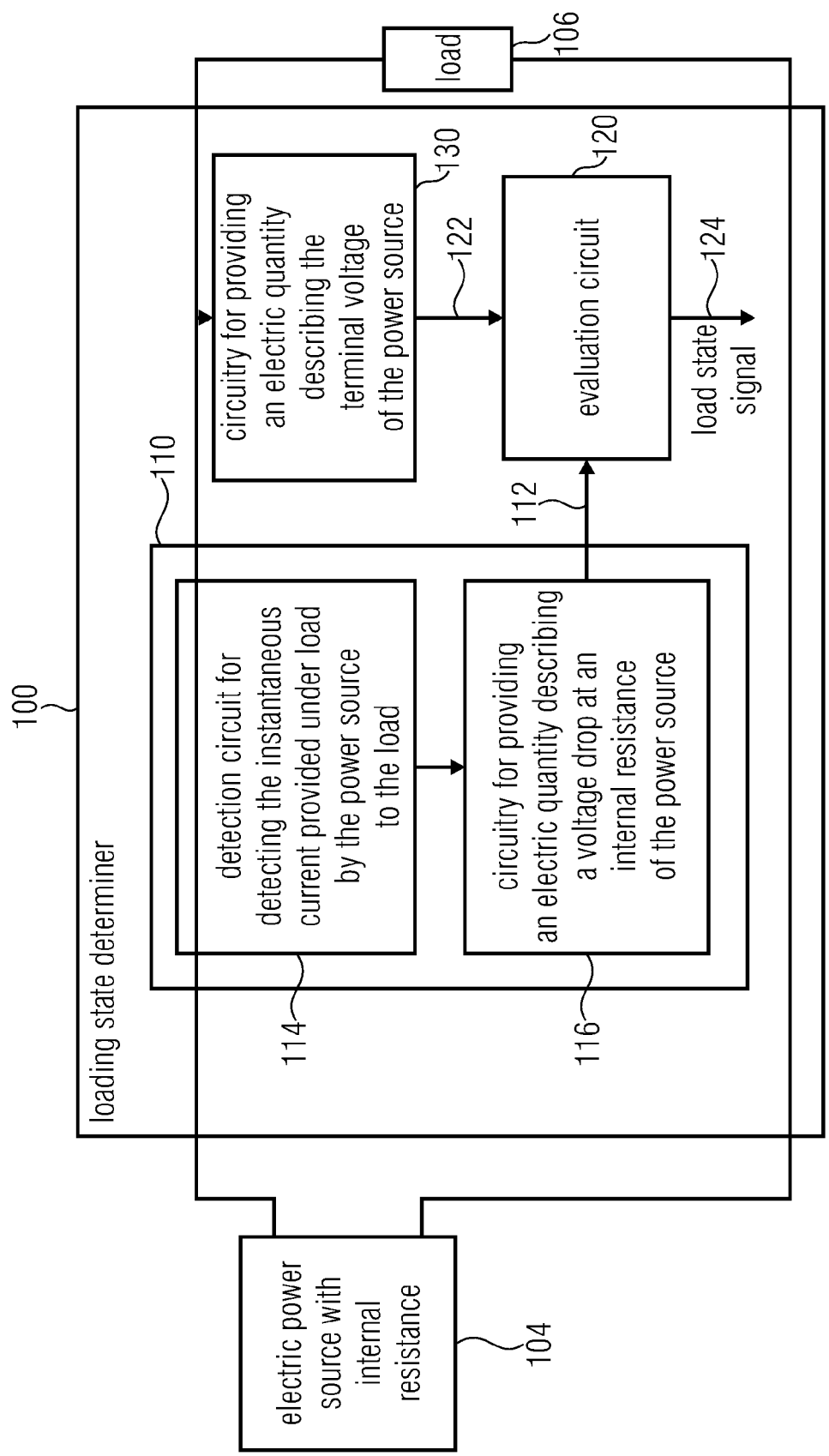
FIG. 1 shows a schematic illustration of a loading state determiner according to a first embodiment of the present invention.

Embodiment According to FIG. 1

FIG. 1 shows a block diagram of a loading state determiner according to a first embodiment of the present invention. The loading state determiner 100 is implemented to determine a loading state of an electric power source 104 that is typically not part of the loading state determiner 100. Here, it is assumed that the electric power source 104 comprises an internal resistance or, more generally, a source impedance which is at least approximately known to the loading state determiner 100 or is determined by the same in some embodiments.

The loading state determiner 100 includes a voltage drop determination circuit 110, which is implemented to provide, based on a detection of an instantaneous current provided under load by the power source 104 to a load 106, which is typically not part of the loading state determiner 100, an electric quantity 112 describing a voltage drop at an internal resistance of the power source 104. Further, the loading state determiner 100 comprises an evaluation circuit 120, which is implemented to obtain, based on the electric quantity 112 describing the voltage drop at the internal resistance of the power source 104 and an electric quantity 122 describing a terminal voltage of the power source, a load state signal 124 carrying information on the current relation between the terminal voltage of the power source and a no-load voltage of the power source.

Thus, all in all, the loading state determiner 100 is implemented to obtain, based on a measurement of an instantaneous value of the current provided by the power source 104 to the load 106 and an instantaneous value of the terminal voltage, the load state signal such that the same describes the instantaneous relation between the terminal voltage of the power source and the no-load voltage of the power source.

The voltage drop determination circuit 110 can comprise, for example, a detection circuit 114 for detecting the instantaneous current provided (under load) by the power source 104 to the load 106 and a circuit assembly 116 for providing the electric quantity 112 describing the voltage drop at an internal resistance of the power source, based on the detected instantaneous current. Additionally, the loading state determiner 100 can include, for example, circuitry 130 for providing the electric quantity 122 describing a terminal voltage of the power source. Thus, the circuitry 130 can be implemented to provide the respective quantity 122 to the evaluation circuit 120.

Figure 2:
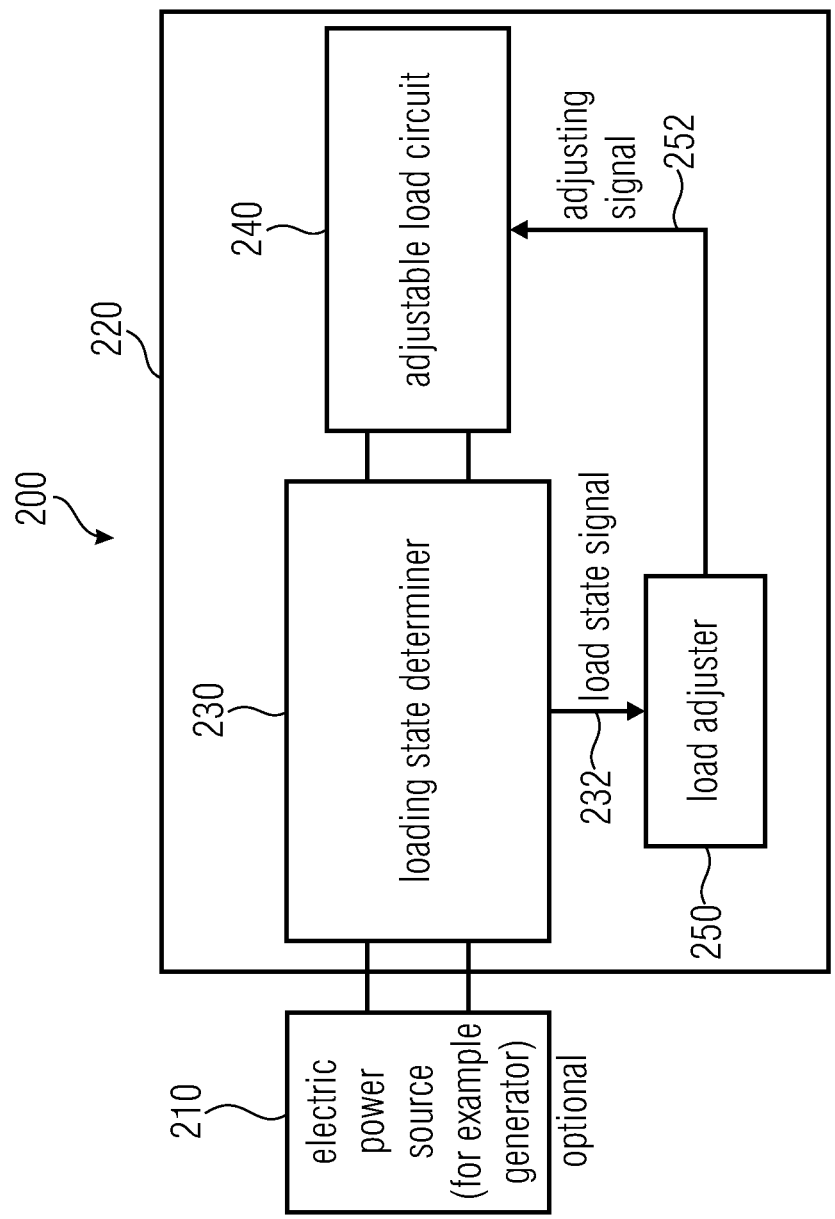
FIG. 2 shows a schematic illustration of a power supply assembly according to a second embodiment of the present invention.

Embodiment According to FIG. 2

FIG. 2 shows a block diagram of a power supply circuit according to a second embodiment of the present invention. The power supply circuit 200 according to FIG. 2 includes an electric power source 210 which can be, for example, an electric generator, and which can correspond to the electric power source 104. Further, the power supply circuit 200 includes a load assembly 220. The load assembly 220 includes a loading state determiner 230 which can, for example, be equal to the above described loading state determiner 100. Further, the load assembly 200 includes an adjustable load circuit 240 which can, for example, correspond to the load 106. Further, the load assembly 220 includes a load adjuster 250.

Thereby, the loading state determiner 230 is connected between the electric power source 210 and the adjustable load circuit 214 to detect the instantaneous current provided by the electric power source to the adjustable load circuit 240, as has already been explained with respect to FIG. 1. The adjustable load circuit 240 is able to change an impedance presented to the electric power source 210. The adjustable load circuit 240 can, for example, be implemented to change an input impedance or an input resistance in dependence on an adjustment signal 252. Alternatively, the adjustable load circuit 240 can be implemented to vary an average current consumption (e.g., by an inductance) in dependence on the adjustment signal 242.

Here, the load adjuster 250 is able to adjust the load in dependence on the load state signal provided by the loading state determiner 230 such that power matching exists between the power source 210 and the adjustable load circuit 240.

Thus, all in all, the loading state determiner 230 can determine whether the terminal voltage of the electric power source 210 is above or below half the no-load voltage of the electric power source 210 or whether the terminal voltage of the electric power source 210 is at least approximately (for example with a tolerance of +/−5% or +/−10%) equal to half the no-load voltage of the electric power source 210. This relation between terminal voltage of the power source and no-load voltage of the power source is indicated by the load state signal 232. Thus, the load state signal 232 gives, for example, immediate information on whether the adjustable load circuit 240 represents an impedance with respect to the electric power source 210 which is higher than an impedance necessitated for obtaining power matching, lower than an impedance necessitated for obtaining power matching or equal to an impedance necessitated for obtaining power matching. Thus, the load adjuster 250 is able to output a respective adjustment signal 252 to the adjustable load circuit 240, which effects a change of the impedance represented by the adjustable load circuit 240 with respect to the electric power source. This enables obtaining a regulation towards a state of optimum (or at least sufficiently good) power matching in dependence on the load state signal 232.

Figure 3:
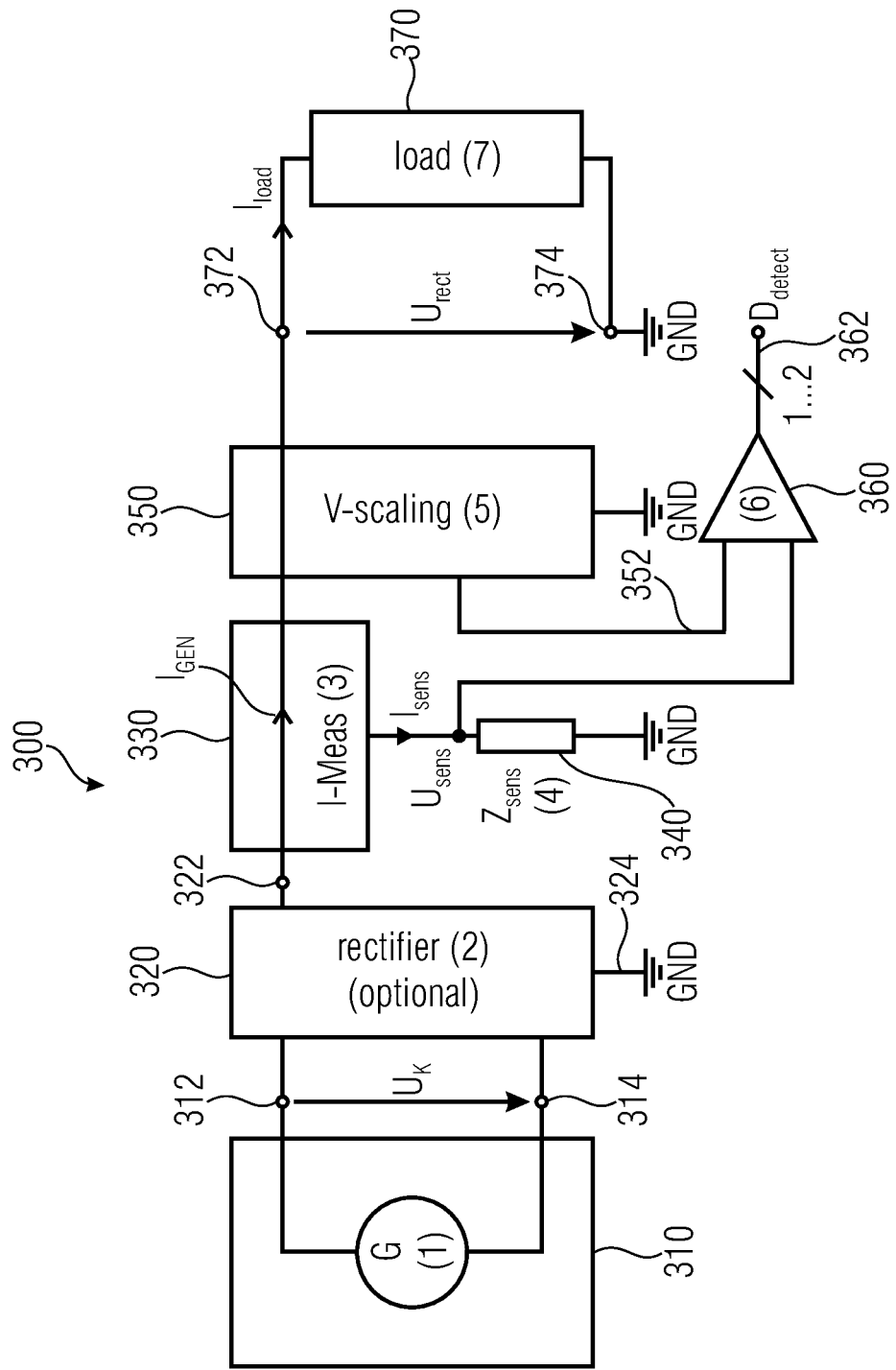
FIG. 3 shows a block circuit diagram of a power supply assembly according to a third embodiment of the present invention.

Embodiment According to FIG. 3

FIG. 3 shows a block diagram of a power supply circuit 300 according to a further embodiment of the invention.

The power supply circuit 300 includes a generator 310 comprising an internal resistance or a source impedance. A terminal voltage $U_K$ can be tapped between a first generator terminal 312 and a second generator terminal 314 of the generator 310. The power supply circuit 300 further includes a rectifier 320 which can be considered optional. Input terminals of the rectifier 320 are coupled to the terminals or generator terminals 312, 314 of the generator 310. A first output terminal 322 of the rectifier 320 is, for example, coupled to a first terminal 372 of a load 370. A second output terminal 324 of the rectifier 320 is, for example, but not necessarily, coupled to a reference potential GND, wherein a second terminal 374 of the load 370 is also coupled to the reference potential GND. Alternatively, the second output terminal 324 of the rectifier 320 can also be coupled in another manner to the second terminal 374 of the load 370.

Further, the power supply assembly 300 includes a current measurement circuit 330 connected at least partly between the generator 310 and the load 370 for detecting the generator current $I_{gen}$ provided by the generator 310 to the load 370 and for generating an auxiliary current signal $I_{sens}$ describing the generator current $I_{gen}$ or being proportional to the generator current $I_{gen}$. Further, the power supply assembly 300 includes a current-voltage converter 340, which is implemented to convert the auxiliary current signal $I_{sens}$ provided by the current measurement circuit 330 into a voltage $U_{sens}$ describing the voltage dropping at the source impedance of the generator 310. Thereby, the current-voltage converter 340 can include an impedance member which can be matched, for example, to the source impedance or the internal resistance of the generator 310. Further, the power supply assembly 300 includes a voltage scaling 350 which is implemented to generate a reference signal 352 which is proportional to the (optionally rectified) terminal voltage $U_{sens}$ of the generator 310. Further, the power supply assembly 300 also comprises a discriminator or comparator 360, which is implemented to receive the voltage $U_{sens}$ describing the voltage drop at the source impedance or at the internal resistance of the generator 310 and the reference signal 352 and to provide, based thereon, discriminator output information in the form of 1-2 discriminator output signals, wherein the discriminator output signals describe a quantity relation (e.g., lower, at least approximately equal or higher) between the voltage $U_{sens}$ and reference signal 352.

Regarding the function of the power supply assembly 300, it has to be noted that by comparing the voltage $U_{sens}$ describing the voltage drop across the source impedance or the internal resistance of the generator 310 and the reference signal 352 describing the terminal voltage or the rectified terminal voltage of the generator 310 (and which is advantageously proportional to the rectified terminal voltage), an immediate statement can be made regarding the loading state of the generator 310. This statement regarding the loading state particularly gives information on whether the impedance of the load 370 is too low, too high or exactly suitable for obtaining power matching between the generator 310 and the load 370. Since the current measurement, i.e., detection of the generator current $I_{gen}$ and detection of the rectified terminal voltage $U_K$ are performed practically simultaneously, for example at the same load, in the embodiments described herein, the loading state can be determined continuously in time, for example even at a single point in time.

In summary, it can be said that FIG. 3 shows a block circuit diagram of a voltage supply circuit having an external generator 310, a rectifier 320, a current measurement 330, a current-voltage converter 340, a voltage scaling 350 for generating a reference signal, which is proportional to the rectified terminal voltage $U_K$, and a discriminator 360 providing one to two output signals, depending on the necessitated implementation. Thereby, the current through the load 370 should be as close as possible to the output current of the generator 310 or the measured current through the current measurement assembly 330.

Figure 4:
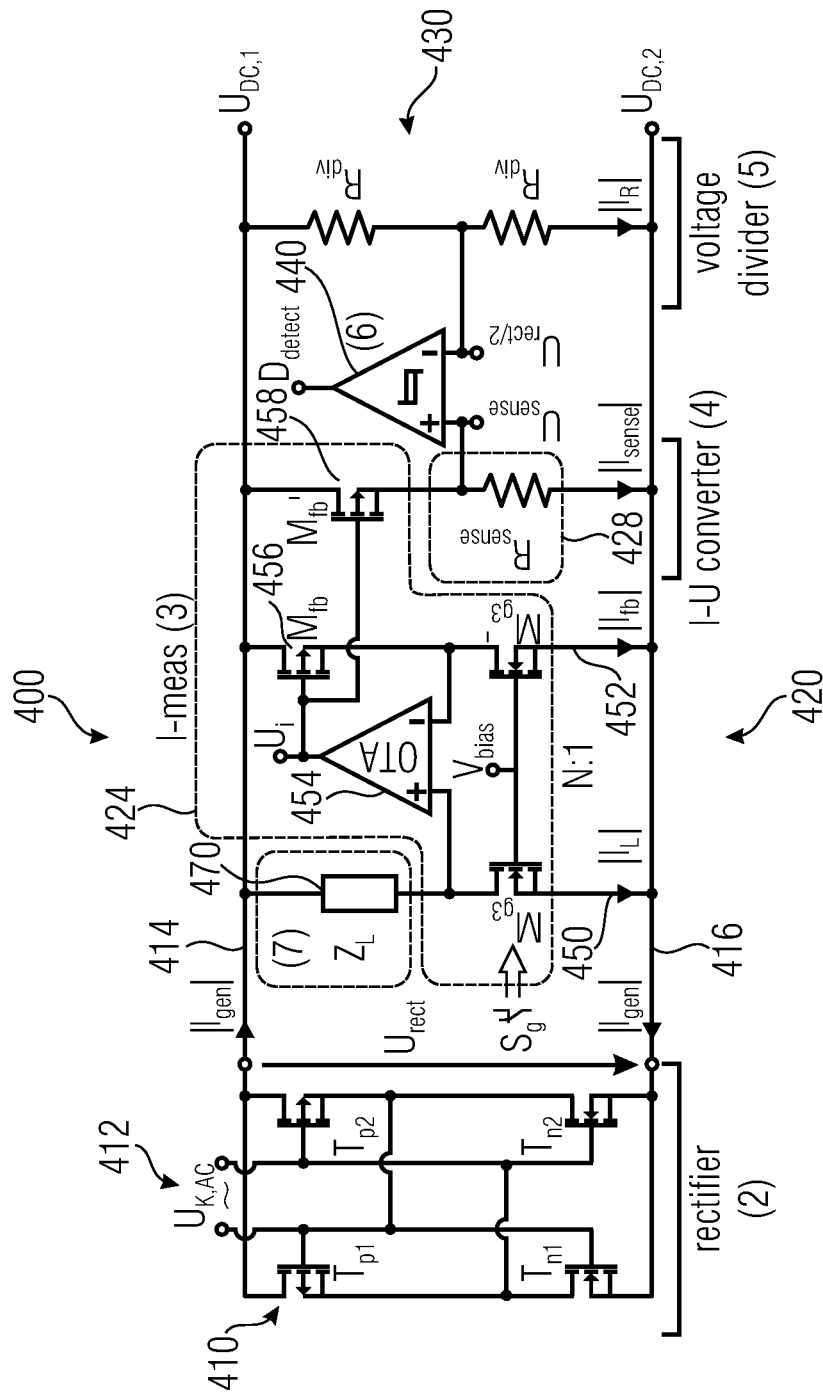
FIG. 4 shows a detailed circuit diagram of a loading state determiner according to a fourth embodiment of the present invention.

Embodiment According to FIG. 4

FIG. 4 shows a detailed circuit diagram of a loading state determiner according to a forth embodiment of the invention. The loading state determiner 400 includes an optional rectifier 410 connected between an alternating voltage input 412 of the loading state determiner and direct voltage lines 414, 416. Further, the loading state determiner 400 includes a voltage drop determination circuit 420 which includes a current detection circuit 424 and a current-voltage converter 428. Additionally, the power supply circuit 400 includes a voltage divider 430 connected between the first direct voltage line 414 and the second direct voltage line 416. Additionally, the loading state determiner 400 comprises a comparator or discriminator 440, which is implemented to compare a voltage $U_{sens}$ provided by the current-voltage converter 428 to a reference voltage $U_{rect/2}$ provided by the voltage divider 430 and to provide, based thereon, a load state signal $D_{detect}$.

In the loading state determiner, a load path (for example, a drain source path or alternatively a collector emitter path) of a current detection transistor 450 is connected in series to a load 470 between the first direct voltage line 414 and the second direct voltage line 416. Thus, the load current $I_L$ making up a significant or predominating portion (for example, more than 90% or even more than 98%) of the generator current provided by the generator $I_{gen}$ through the load path of the current protection transistor 450 at least when the load 470 is activated. The current detection transistor 450 is, for example, an n-channel field effect transistor (or, alternatively, an npn-bipolar transistor). Further, the current detection circuit 424 includes a mirror transistor 452 corresponding, as regards to its qualitative structure (for example as regards to the transistor type the used materials and the layer sequence) to the current detection transistor 450. However, typically, a channel width (or alternatively an emitter area) of the current detector transistor is by a factor N larger than a channel width (or alternatively emitter area) of the mirror transistor 452. Further, it should be noted that control terminals, e.g., gate terminals (or alternatively base terminals when using bipolar transistors) of the current detection transistor and the mirror transistor 452 are connected to one another. Further, both a source terminal (e.g., source terminal or emitter terminal) of the current detection transistor 450 and a source terminal of the mirror transistor 452 are (for example, directly) connected to the second direct voltage line 416. Thereby, it can be achieved that the control voltages (e.g., gate source voltages or, alternatively, base emitter voltages) of the current detection transistor 450 and the mirror transistor 452 are of the same quantity. Additionally, the current detection circuit 424 comprises a control circuit which is implemented to achieve that a load path voltage (for example, drain source voltage) of the mirror transistor is of exactly the same quantity as a load path voltage of the current detection transistor. Thereby, the control assembly comprises, for example, an operational amplifier 454 as well as a first current bank transistor 456. Inputs (+,−) of the operational amplifier 454 are connected, for example, to the drain terminal of the current detection transistor 450 and the drain terminal of the mirror transistor 452. Further, a load path (e.g., drain source path) of the first current bank transistor 456 is connected in series to the load path of the mirror transistor 452 between the first direct voltage line 414 and the second direct voltage line 416. Further, the first current bank transistor is, for example, a p-channel field effect transistor. Further, an output of the operational amplifier 454 is connected to the control terminal, for example, gate terminal of the first current bank transistor 456. In this way it can be obtained that during operation the operational amplifier 454 adjusts the voltage at the gate terminal of the first current bank transistor 456 and, consequently, the current flow through the load path of the first current bank transistor 456 such that the drain source voltage across the mirror transistor 452 will essentially have the same quantity as the drain source voltage across the current detection transistor 450.

Thereby, it can further be achieved that both the input voltage at the inputs (+,−) of the operational amplifier 454 and the output voltage $U_i$ of the operational amplifier 454 is, as regards to potential in a range between the potential applied to the first direct voltage line 414 and the potential applied to the second direct voltage line 416. Thus, it is possible to use the potentials applied to the direct voltage lines 414, 416 for supplying the operational amplifier 454. However, this is not obligatory.

Further, the current detection circuit comprises a second current bank transistor 458, which is connected such that its control voltage (e.g., gate source voltage) is equal to the control voltage of the first current bank transistor 456. Thus, assuming an appropriate operating point, it is achieved that a load path current of the second current bank transistor 458 is equal to a load path current of the first current bank transistor 456 or that the load path current of the second current bank transistor 458 is at least proportional to the load path current of the first current bank transistor 456.

All in all, by the current detection circuit 424, it is achieved that the load path current of the second current bank transistor 458, which is supplied to the current-voltage converter 428, is proportional to the load current $I_L$ flowing through the load 470.

The impedance member acting as current-voltage converter 428 is connected in series to the load path of the second current bank transistor 458 between the first direct voltage line 414 and the second direct voltage line 416. The impedance member $R_{sens}$ can, for example, be a resistor. Alternatively, another impedance member or a combination of several impedance members can be used for reproducing the source impedance of the generator in a best possible manner. An impedance of the impedance member (for example, resistor) forming the current-voltage converter 428 is further selected such that the voltage $U_{sens}$ generated by the current-voltage converter 428 is a measure for a voltage drop at the source impedance or internal resistance of the generator not shown in FIG. 4. For example, by appropriately dimensioning the current-voltage converter, it can be achieved that the voltage $U_{sens}$ is half the amount of the voltage drop at the internal resistance of the generator or the power source.

The voltage divider 430 can, for example, be implemented such that the voltage $U_{rect/2}$ is half the size of the (rectified) terminal voltage $U_K$ of the power source or the generator. Further, the comparator or discriminator 440 is implemented to compare the voltage $U_{sens}$ applied to the current-voltage converter 428 to the voltage $U_{rect/2}$ applied to the tap of the voltage divider 430 (or the respective potentials) and to provide, as a load state signal, a signal describing a relation as regards to quantity (higher or lower or approximately the same) between the voltages (or potentials) $U_{sens}$ and $U_{rect/2}$.

Regarding the mode of operation of circuitries 300 and 400 as well as the other circuitries, it has to be stated in summary that the present invention assumes that the source impedance (or the internal resistance) of the power source or the generator is known, since the same can typically be directly derived from the specifications of the generator. Thus, for low-power detection, a current proportional to the instantaneous generator current $I_{gen}$, for example the current $I_{sens}$ or the current through the load 428 of the second current bank transistor 458 is generated with a high and known division factor N. This is performed, for example, by mirroring the current $I_L$ twice by using transistors 450, 452, 456, 458 as well as the operational amplifier 454, wherein the division factor is obtained, for example, by different channel widths of the transistors. The current proportional to the instantaneous generator current, for example $I_{sens}$, is routed to a "sensor" resistor $R_{sens}$ (or a "sensor" impedance $Z_{sens}$) which results in a current-voltage conversion. Thus, a voltage $V_{sens}$, sometimes also referred to as $U_{sens}$ (cf. FIG. 4) results across the "sensor" resistance $R_{sens}$ (or also across the sensor impedance $Z_{sens}$).

The value of the sensor resistor or detection resistor, i.e., $Z_{sens}$, $R_{sens}$ is, hence, for example, half of the generator impedance×division factor N. When the voltage $U_{sens}$ currently has the value of half the instantaneous terminal voltage $U_K$ or $U_{rect}$, for example provided by the voltage scaling 350 or the voltage divider 430, the terminal voltage is, again, exactly half of the no-load voltage. Generating half the terminal voltage can thereby be performed, for example, simply via a high-resistance voltage divider, for example the voltage scaling 350 or the voltage divider 430.

The circuitry 400 can be modified in different ways. Generally, for example, for specific purposes, an alternative ratio can be adjusted deviating from half the no-load voltage, by selecting the sensor resistor or detection resistance $Z_{sens}$ or $R_{sens}$, by selecting the division factor N and/or by selecting the voltage divider ratio of the voltage scaling 350 or the voltage divider 430. Further, the sensor resistor or detection resistor $Z_{sens}$ or $R_{sens}$ can be replaced by a complex impedance, for example to react to specific generator characteristics (for example with respect to the source impedance).

However, in some embodiments, it is advantageous that the voltage scaling 350 or the voltage divider 430 provides half of the terminal voltage at the tap. The reason, why in this specific case half the terminal voltage is used, is that the terminal voltage can, in some cases, really be the highest voltage in the system. Since in the field of energy-harvesting, external voltage is often to be prevented, it is technically difficult and power intensive to generate a voltage constantly exceeding the terminal voltage of the single generator (e.g., the generator 310). Thus, a simple and cost-effective implementation is enabled by the fact that the occurring potentials, in particular the potentials at the inputs of the comparator or discriminator 440, are between a lower supply potential applied, for example, to the second direct voltage line 416, and an upper supply potential applied, for example, to the first direct voltage line 414.

In the following, several details will be described with regard to the comparator or discriminator 360, 440. Detecting whether the terminal voltage $U_K$ or $U_{rect}$ is lower, the same or higher than half the no-load voltage can be performed via the comparator circuit 360, 440 (also referred to as "discriminator").

If this is a simple comparator, the same can merely detect a higher/lower state (or merely differentiate whether the voltage $U_{sens}$ is higher or lower than the voltage $U_{rect/2}$, or the voltage at the tap 352 of the voltage scaling 350). In combination with optional trigger logic, the transition from a state of low terminal voltage $U_K$ or $U_{rects}$ to a state of higher terminal voltage can be detected. The signal change output by a simple comparator can then be used by the power converter (which can, for example, form the load 370 or whose input can act as the load 470) for performing continuous load matching.

In some embodiments, a more complex comparator circuit or discriminator circuit 360, 440 can be used. For such a more complex comparator circuit, two simple comparators can be connected to a window comparator. Connected by logic, it can be signalized to the power converter (which can form the load 370 or whose input can represent the load 470) whether the instantaneous terminal voltage $U_K$ or $U_{rect}$ is of a similar amount as the instantaneous no-load voltage, i.e., it is within the window region or whether the instantaneous terminal voltage is above or below the window region. Then, there are three signal states available for the power converter.

If, alternatively, instead of the comparator 360, 440, a linear different amplifier is used, an analog signal can be output representing a measure for obtaining the desired ratio (here: 0.5) of terminal voltage to no-load voltage.

In the following, several details regarding the rectifier will be explained. By appropriate rectifiers 320, 410 it can, for example, be ensured that the terminal voltage $U_K$ and the rectified terminal voltage $U_{rect}$, which is finally used by the detector, differ only marginally or not at all. Details in this regard can be found, for example, in the publications C. Peters, D. Spreemann, M. Ortmanns, Y. Manoli, "A CMOS integrated voltage and power efficient AC/DC converter for energy-harvesting applications", Journal of Micromechanics Micro engineering, JMM, 18 104005, Issue 10, Oct. 2008, G. Bawa, J. Uei-Ming, M Ghovanloo, "High Efficiency Full-Wave Rectifier in Standard CMOS Technology", Proc. IEEE $50^{th}$ Midwest Symposium on Circuits and Systems, MWS-CAS, Montreal, Canada, pp. 81-84, 2007 and S. Guo, H. Lee, "An Efficiency-Enhanced CMOS Rectifier With Unbalanced-Biased Comparators for Transcutaneous-Powered High-Current Implants", IEEE Journal of Solid-State Circuits (JSSC), vol. 44 no. 6, pp. 1796-1804, June 2009.

For example, a switched rectifier can be used, where a voltage drop is reduced compared to conventional diode bridge rectifiers by using transistors instead of the diodes. A respective rectifier is shown in FIG. 4 in detail at reference number 412.

In the following, an optional supplement of the inventive loading state determiner is discussed, which allows a particularly universal applicability of the loading state determiners under many different operating conditions. Normally, the internal resistance of many generators is constant and independent of the mode of operation. Thus, as supplement, a single automatic adjustment of the detection circuit 360, 440 or the sensor resistor (or detection resistor) $Z_{sens}$, $R_{sens}$ can be performed. The internal resistance of the generator, for example the generator 310, is determined, for example, automatically, by feeding a known test current into the generator and by measuring the change in the voltage. Then the detection circuit can be matched automatically to another generator with deviating internal resistance or to different operating conditions Via an adjustable sensor resistance (or detection resistance) or via an adjustable division factor N of the current detection device 330, 424 or the current mirror. Alternatively, the scaling ratio of the voltage scaling 350 or the division ratio of the voltage divider 430 can be matched.

In the following, further optional details regarding the realization of the loading state determiner 400 will be explained. As already described above, FIG. 4 shows a specific implementation of the detector in terms of circuit engineering. Both for the current-voltage conversion 340 performed via the detection resistor $R_{sens}$ and for voltage scaling 350 performed by resistors $R_{div}$ of the voltage of the voltage divider 430, ohmic resistances are used. The discriminator 360 is a comparator 440. Here, in the implementation in terms of circuit engineering, generally, an impedance has been provided as load element 470.

Additionally, due to the balance of a rectifier, the voltage $U_{dc,1}$ or the voltage $U_{dc,2}$ can selectively assume the positive or negative direct voltage potential.

In the following, some aspects and possible modifications of the circuitry 400 will be stated:

The voltage $U_K$ is the output voltage of a generator 310 and this output voltage can be an alternating voltage $U_{K,AC}$ or a direct voltage $U_{K,DC}$.

If the generator 310 provides an alternating voltage $U_{K,AC}$, typically, a rectifier 320, 410 will be necessitated.

If the generator 310 already provides a direct voltage $U_{K,DC}$, the rectifier 320, 410 can be omitted.

The direct voltage potentials $U_{DC,1}$ and $U_{DC,2}$ can selectively be used as reference potential or ground or can selectively represent the positive or negative direct voltage potential for supplying the load.

The current $I_L$ is the significant load current and should closely approximate the generator output current $I_{gen}$ or even be equal to the generator output current $I_{gen}$. All other currents should, in sum, be significantly lower than $I_L$ or $I_{gen}$. Advantageously, $I_L$ should deviate from $I_{gen}$ by 10% at most.

The detection signal $D_{detect}$ can optionally be provided to a power converter or voltage converter. The converter itself can then, for example, be part of the load 370, 470. If the converter is not part of the load 370, 470, it only servers for voltage matching of the (rectified) generator voltage ($U_{DC,1}$, $U_{DC,2}$) to an application 370, 470. The converter will then be supplied externally.

The switching transistor 450, also indicated by $M_{g3}$ or $S_g$ can, in some embodiments, simply also be considered as on/off switch.

Figure 5:
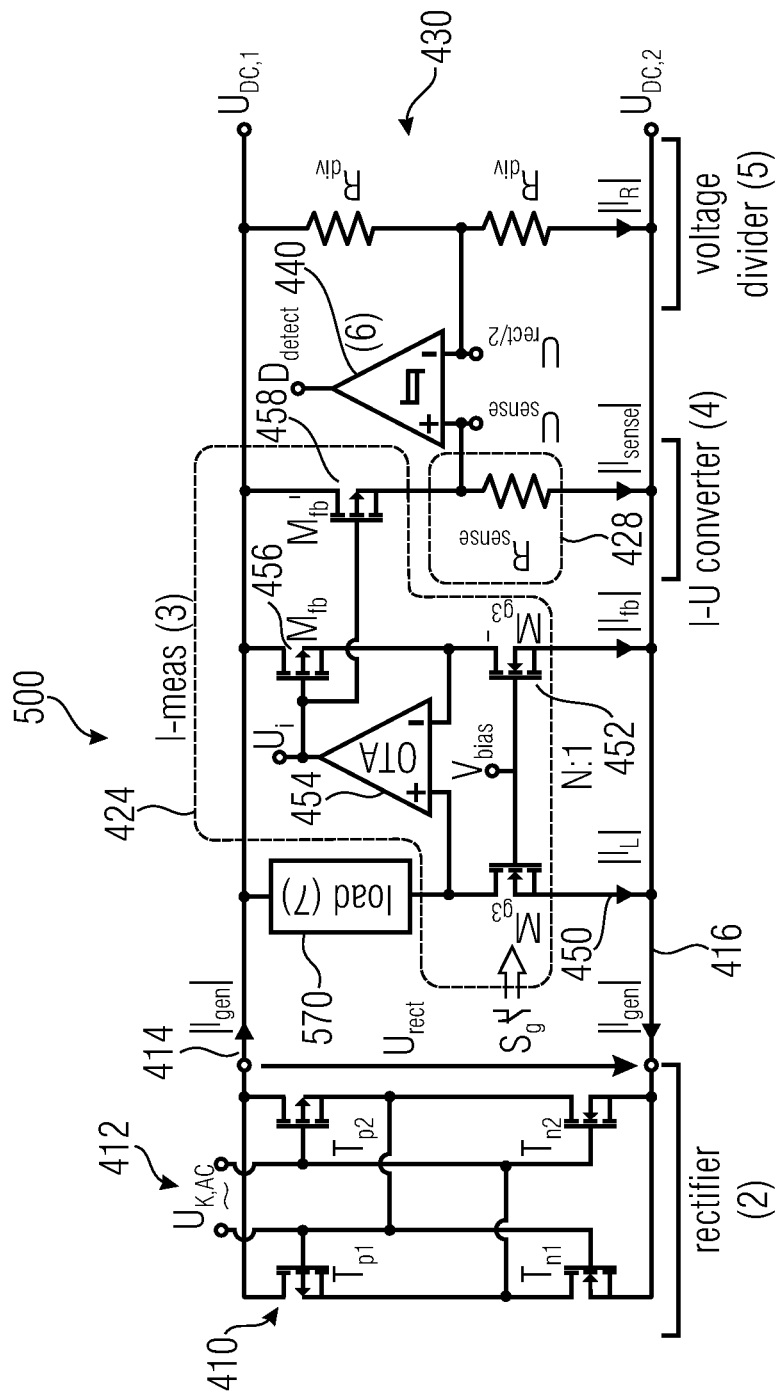
FIG. 5 shows a detailed circuit diagram of a loading state determiner according to a fifth embodiment of the present invention.

Embodiment According to FIG. 5

FIG. 5 shows a detailed circuit diagram of a loading state determiner 500 according to a fifth embodiment of the invention. Here, FIG. 5 shows a specific implementation of the detector in terms of circuit engineering having a general electric consumer or load 570. The general electric consumer or the load 570 corresponds to the load 370 according to FIG. 3 or the load 470 according to FIG. 4.

Since the circuit 500 according to FIG. 5 is, apart from that, very similar to the circuitry 400 according to FIG. 4, the same features and signals in the circuitries 400 or 500 are indicated by the same reference numbers.

The above explanations, also with regard to possible optional extensions and modifications apply accordingly also to the circuitry 500.

Figure 6:
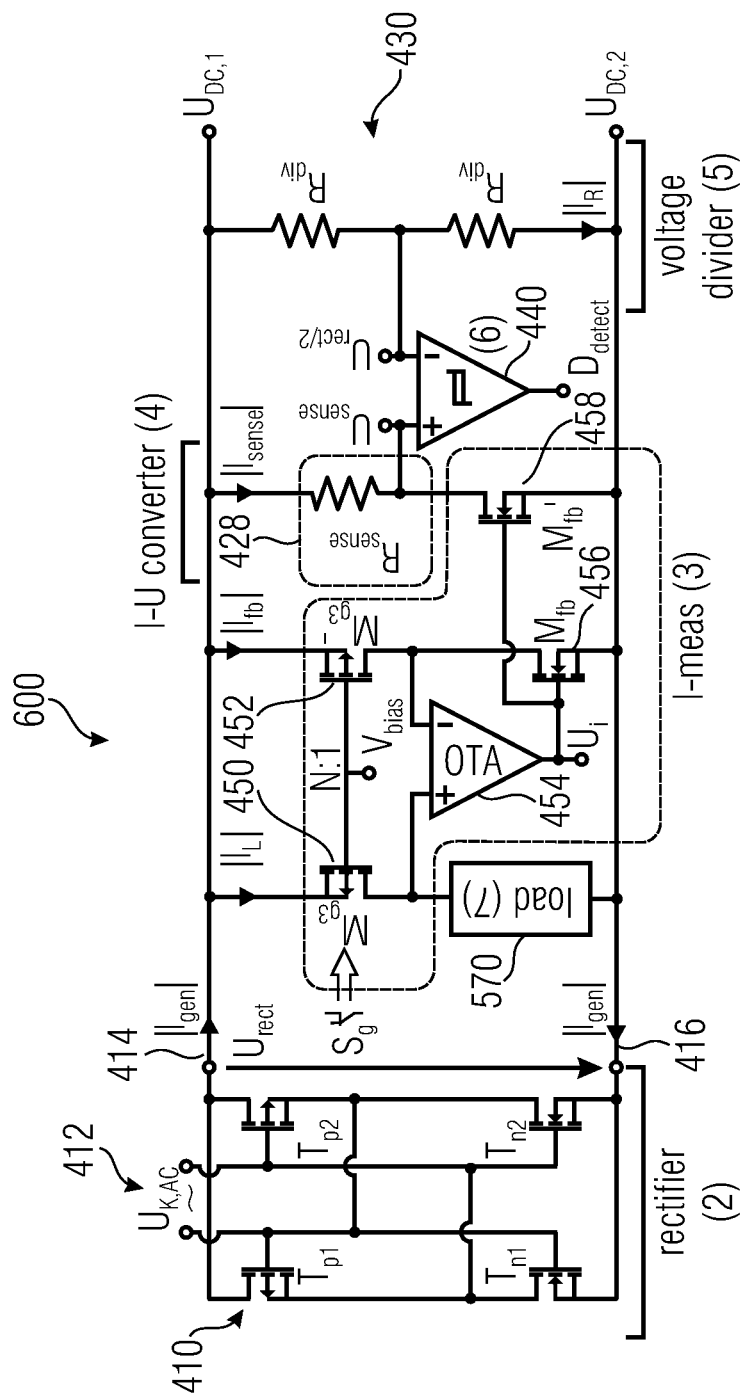
FIG. 6 shows a detailed circuit diagram of a loading state determiner according to a sixth embodiment of the present invention.

Embodiment According to FIG. 6

FIG. 6 shows a detailed circuit diagram of a loading state determiner 600 according to a sixth embodiment of the invention. The loading state determiner 600 according to FIG. 6 is substantially complementary to the loading state determiner 500 according to FIG. 5. In other words, members are replaced by complimentary members. For example, p-channel field effect transistors are replaced by n-channel field effect transistors. Also, n-channel field effect transistors are replaced by p-channel field effect transistors.

Apart from the complimentary implementation of the members, the statements made above with regard to circuitries according to FIGS. 3, 4 and 5 apply accordingly.

In summary, it has to be stated that FIG. 6 shows a mirrored implementation of the detector in terms of circuit engineering, wherein the load 570 is placed between the switching transistor 450 and the direct voltage line carrying the potential $U_{DC,2}$.

Figure 7:
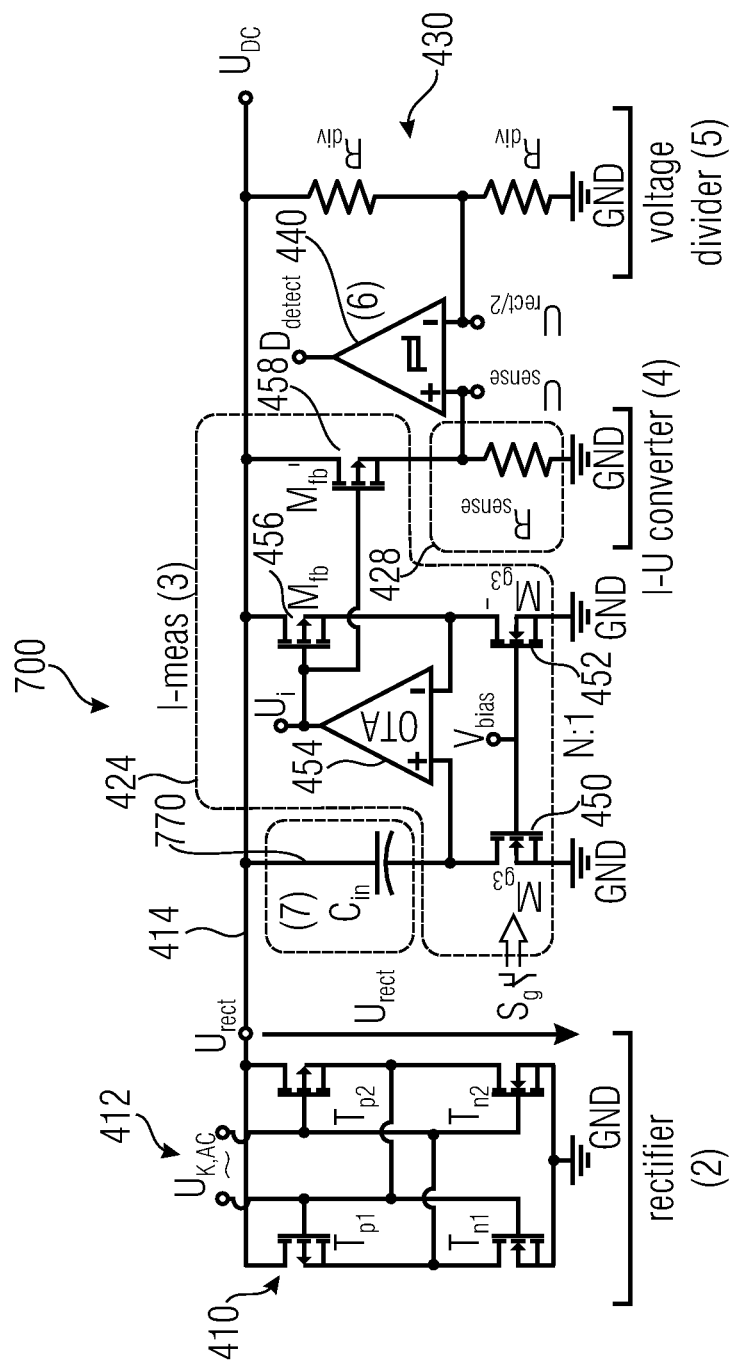
FIG. 7 shows a detailed circuit diagram of a loading state determiner according to a seventh embodiment of the present invention.

Embodiment According to FIG. 7

FIG. 7 shows a detailed circuit diagram of a loading state determiner according to a seventh embodiment of the invention. The loading state determiner 700 is very similar to the loading state determiner 400 according to FIG. 4 and also to the loading state determiner 500, 600 according to FIGS. 5 and 6, so that the same means and signals are indicated by the same reference numbers.

The loading state determiner 700 differs from the loading state determiners 400, 500 essentially in that the load 470 or the load 570 is replaced by a capacitor 770.

Further, the second direct voltage line 416 is replaced by a reference potential connection connecting the reference potential points GND.

In summary, it has to be stated that FIG. 5 shows, in terms of circuit engineering, a specific implementation of the detector with the capacitor 770 as load 370, 470, 570.

Summary of the Inventive Solution According to the Above Embodiments

The above described embodiments of the invention bring about significant improvements in the operation of a power converter. For a power converter, which is connected to an energy-harvesting generator, to have the maximum possible generator power available, this power converter should load the generator such that its terminal voltage corresponds to half its no-load voltage. The invention presented herein allows exact detection, during the load operation, whether this is the case, or provides a quantity for measuring the deviation. Above this, the circuit or the detection principle can determine whether the terminal voltage is higher or lower than this optimum half no-load voltage.

The invention can signalize to a power converter connected to a generator quasi continuously and without delay how far the terminal voltage has approached a specific ratio (e.g., for example, half) of the instantaneous no-load voltage. This signal or this information can be used for signalizing to a power converter to what extent its operating parameters (e.g., its input impedance) should be adapted or whether optimum operation has been achieved. Due to the fact that it can also be signalized whether the terminal voltage is above or below the instantaneous half no-load voltage, the regulator necessitates less complex optimization algorithms and the provided signal can serve directly as indicator for a load-matched operation.

In the current case, it is signalized whether half the instantaneous no-load voltage is applied to the terminals of the generator or whether the same has just been fallen below or exceeded.

Thus, the problem is to generally detect during loading of the generator when the optimum load case (i.e., load matching in that the load impedance has the value of the complex conjugate source impedance) or the associated half no-load voltage is achieved. This object is solved by the loading state determiner described based on FIGS. 1 to 7.

The loading state determiners described herein offer significant advantages compared to conventional solutions. For example, detection during operation, i.e., while the generator is loaded, is possible.

With only one adjustable parameter ($R_{sens}$), the circuit can signalize continuously and with little effort an optimum generator loading to the (in some embodiments necessitated) power and voltage converter or can indicate to the converter in what direction it should change the generator loading.

The generator current is converted directly into a comparison voltage (e.g., $V_{sens}$), which is compared to a proportional value (here: proportionality factor 0.5) of the actual terminal voltage. Via simple comparator (also referred to as "discriminator") the necessitated signal can be generated in a simple way, indicating, for example, the loading state.

The simple implementation in terms of circuit engineering, which has, for example, been explained in detail based on FIGS. 3 to 7, allows a very low-power determination of the described output signals (for example, the signal $D_{detect}$). In embodiments according to the invention, no analog-digital converter, no microprocessor and also no external reference quantity is necessitated.

In some embodiments, for example the embodiments according to FIGS. 4, 5 and 6, no additional series losses in the power path ($U_{rect}$) are caused by the combination of the current measurement with a power switch (for example the power switch $S_g$ shown in FIG. 4).

In the following, some of the significant advantages resulting for the user by the present invention will be briefly summarized.

By the external sensor impedance or the resistor $R_{sens}$ or $Z_{sens}$ of the current-voltage converter, the user can easily match the inventive detector (or loading state determiner) to different generators. The typically low power consumption of the whole detector (typically few microwatt) loads the power budget of a typical energy-harvesting system only negligibly. However, the realization about optimum loading—which this detector enables—frequently results in a significant gain of generator power. Thus, the overall power balance, for example of an energy-harvesting system, is improved when using the inventive detector or loading state determiner. Thus, a power converter requires no expensive algorithm or assumption for determining the optimum load case. This means the regulator design for the power converter(s) can be implemented in a simple manner. Thus, their internal power consumption, area requirements and development time are reduced.

The low consumption of the detector is easily compatible with the mostly limited power budgets of typical energy-harvesting systems. In many cases, this enables the application of a load-matched generator operation in the first place. Thereby, a generator can be operated more likely within the optimum operating point as in conventional assemblies which results in a higher output power. This allows, on the one hand, the operation of more complex and intelligent user electronics with the same generator, i.e., some applications have additional functionality. If the functionality already achieved in such applications is sufficient, a smaller generator can be used, since the same can now operate in the matched operation and, hence, provides sufficient power.

Fields of Application

Thus, in summary, it has to be stated that the usage of embodiments according to the present invention results, in many cases, in an improved applicability of energy-harvesting systems. Last but not least, the present invention helps to apply micro generators more efficiently and, hence, to make energy self-sufficient devices more accessible on the market or to make them accessible more easily (or cheaper). By energy self-sufficient operation, in particular service and maintenance work is reduced or can even be completely omitted. The reliability of the overall system (which includes an energy-harvesting system) is significantly increased, since frequent damages of the cable inlet or self-discharge of galvanic cells will not occur. Especially in mechanical engineering, cable inlets, which are frequently subject to constant mechanical buckling and tensile loading as well as chemical loading (cooling and vapors), represent the most frequent cause of failure of a plant. Also, in the automotive industry, concepts of self-sufficient operation of remote sensor assemblies for saving weight-increasing and, hence, fuel-consuming wiring are taken into consideration. Additionally, especially in sensor technology, new fields of application can be developed. In fields of application where a realization is hardly possible or very expensive with conventional wire-bound technology, an energy self-sufficient sensor node can now be installed (by using the present invention). Examples for this are building technology, industrial high temperature plants or also remote cold fields of application, where galvanic cells frequently fail. Generally, by saving galvanic cells, an ecological aspect or advantage results, since no such energy carriers have to be used any longer in the energy self-sufficient systems with micro generators. Thus, in summary, it has to be stated that the invention is very well suitable for the usage in connection with energy self-sufficient systems which are currently high in demand.

Thus, embodiments according to the invention can be used in energy self-sufficient systems, for example in the automotive industry, in the semiconductor industry, in tire pressure sensor technology and in the industry and building technology.

Regarding the fields of application of the invention, it has to be stated that in particular building monitoring and building controls, plant construction as well as mechanical engineering and last but not least the automotive industry already nowadays demand miniature generators for self-sufficient current supply (also referred to as energy-harvesting). In all three fields, far reaching application and product innovations can result in lasting success on the market.

The energy supply of portable electronic systems (for example for so-called ubiquitous computing) sensor systems (for example in tool machines, flats or as medical implants) and self-sufficient micro electronic systems (e.g., digital signal processors with low power consumption) is increasingly a limiting factor in the application, usage and further distribution of such systems. Still, primary or secondary batteries are used for the stated approaches. Apart from weight and installation size, the limited period of life, low reliability and the oftentimes difficult and even impossible replacement are significant disadvantages in their usage. Additionally, environmental issues regarding their disposal have to be considered. Available energy-harvesting systems frequently have the problem that either a large generator would be necessitated or the application frequently only functions insufficiently, since the power drain from the generator is very inefficient. Despite these disadvantages, an increase of the demand, for example for secondary batteries from about eight billion parts per year to more than 10 billion parts per year can be expected. Due to the disadvantages of batteries on the one hand and due to the increasing significance of self-sufficient/autonomous systems on the other hand, alternative approaches for energy supply are of high significance. Here, even when substituting only a small portion of the battery market, a significant market volume would be possible in the future. But not only the opportunities for partial substitution of the battery market alone show the market options of such energy-harvesting systems or energy self-sufficient systems. Also, the newly arising fields of application of sensor technology and electronics will bring about an increasing demand and raised sales potential.

The inventive concept of being able to determine the loading state of an energy source very efficiently, allows increasing the efficiency when using the available generator power and hence improves the cost benefit ratio in energy-harvesting systems.

Further Advantages Compared to Conventional Concepts

Embodiments according to the invention manage to overcome the disadvantages of conventional solutions. In particular, none of the known methods can determine the no-load voltage or a quantity proportional to the same from the terminal voltage (of an energy source or a generator) during operation (i.e. during loading). This is made possible by embodiments of the invention.

Measuring the voltage, whether at specific intervals or continuously, as it is normally used necessitates either digitalization or analog storage of the measurement value. Both necessitate processing power for representing the value of the terminal voltage in a sufficiently accurate manner, or can experience variation over time, for example by leakage currents. Additionally, in such conventional concepts, it has to be ensured that the operating conditions, i.e. the generator power and generator voltage, do not significantly change, for example between a loaded and an unloaded state. Especially in energy-harvesting, where low powers are typical and variations of generated power are frequently experienced, this requirement is very disadvantageous or hard to fulfill. However, according to the invention, a statement whether the terminal voltage corresponds to half the no-load voltage or is above or below the same is determined while the power source is loaded.

In conventional measurements with specific test loadings, a more complex control and evaluation circuit is necessitated. The test current to be generated has to be provided with sufficient precision, and the measurement data have to be detected accurately and subsequently processed and stored. Here, change of generator power or voltage is also an additional basic problem. However, according to the invention a simple circuit can be used. The inventive concept allows especially the determination of information on loading state describing a relation between the terminal voltage of the power source and the no-load voltage of the power source by using measurement quantities that are obtained in a single common load state.

The conventional usage of an unloaded additional generator operated in parallel carries the risk of inaccuracies and malfunctions by structural variations, operating influences or also by features deviating due to aging. Additionally, this solution is area and cost intensive and can cause disruption in operation when malfunctioning. The inventive concept, on the other hand, can be implemented in a cost effective manner and is subject to comparatively low spurious influences.

In summary, it can be said that embodiments according to the invention solve the problem of detecting, while a generator (or generally a power source) is loaded, when an optimum load case or an associated half no-load voltage is achieved, i.e. when the load impedance has the value of the complex conjugate source impedance (impedance of the generator) (frequently referred to as "impedance matching").

Further, in summary, it has to be said that the present invention provides an electronic interface for an energy harvester. The electronics interface drawing power from the generator and storing the same on a buffer necessitates information on the loading state of the generator, since otherwise the load-matched operation will not function satisfactorily and the generator power will not be at a maximum. The inventive concept or the inventive circuit can detect in a simple and power saving manner whether the generator runs in the load-matched operation or whether the same is overloaded or underloaded. The circuit principle described herein can provide the above stated information.

Figure 8:
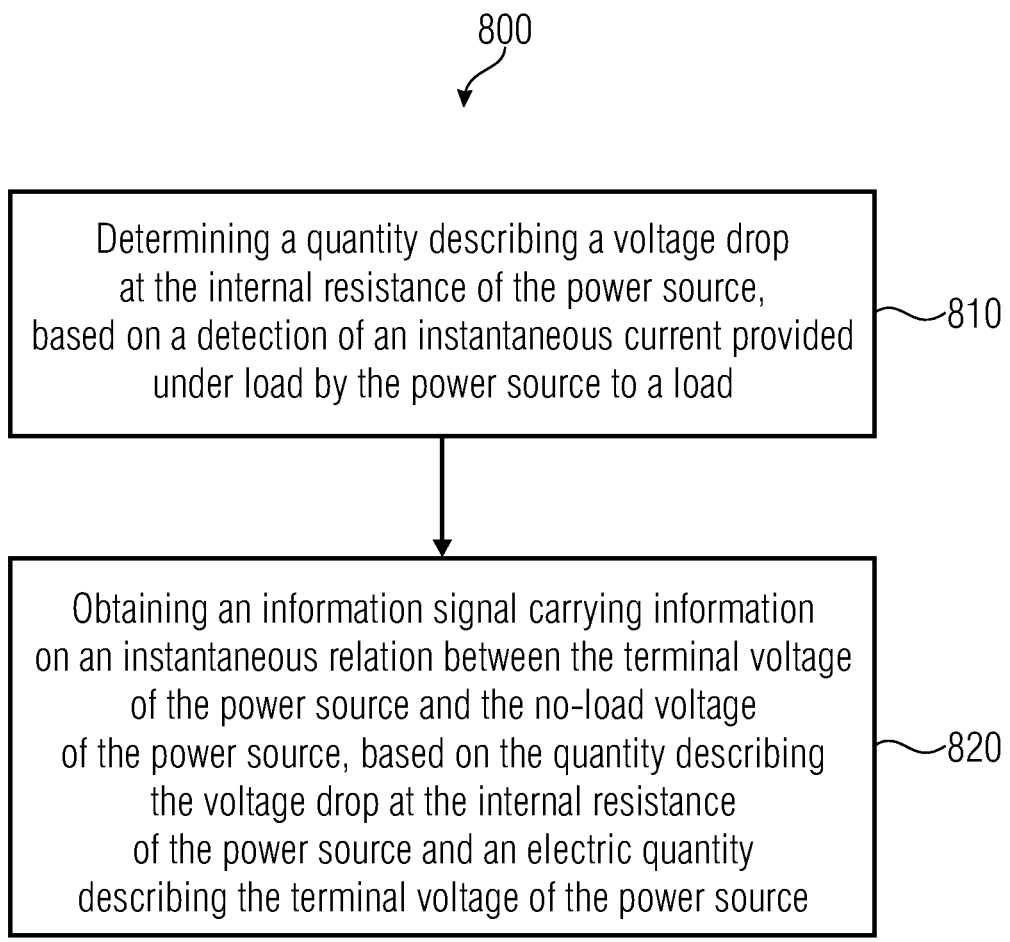
FIG. 8 shows a flow diagram of a method for determining a loading state according to an eighth embodiment of the present invention.

Method According to FIG. 8

FIG. 8 shows a flow diagram of an inventive method 800 for determining a loading state of an electric power source comprising a source impedance (for example an internal resistance).

The method according to FIG. 8 comprises a step 810 where a quantity is determined describing the voltage drop at the source impedance (for example the internal resistance) of the power source. This quantity is determined based on detecting an instantaneous current provided under load by the power source to a load.

The method 800 further includes a step 820 where an information signal is obtained carrying information on an instantaneous relation between the terminal voltage of the power source and the no-load voltage of the power source. This information signal is obtained based on the quantity describing the voltage drop at the internal resistance of the power source and an electric quantity describing the terminal voltage of the power source.

Further, all those features and functionalities that have already been described with respect to the inventive devices can be added to the method 800 according to FIG. 8.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A loading state determiner for determining a loading state of an electric power source comprising a known source impedance, comprising:
a voltage drop determination circuit, that provides, an electric quantity describing a voltage drop at the known source impedance of the power source and being that is proportional to an instantaneous current, based on a detection of the instantaneous current provided under load by the power source to a load; and
an evaluation circuit that acquires, a load state signal indicating an instantaneous relation between the terminal voltage of the power source and a no-load voltage of the power source based on the electric quantity describing the voltage drop at the source impedance of the power source and an electric quantity proportional to a terminal voltage of the power source or a rectified terminal voltage of the power source,
wherein the evaluation circuit compares the electric quantity describing the voltage drop at the source impedance of the power source to the electric quantity that is proportional to the terminal voltage of the power source or to the rectified terminal voltage of the power source, to determine the relation between the terminal voltage of the power source and the no-load voltage of the power source;
wherein the evaluation circuit provides the load state signal such that the load state signal indicates whether the terminal voltage of the electric power source is at least approximately equal to the half of the no-load voltage of the electric power source or differs by more than a predetermined tolerance from the half of the no-load voltage, or
wherein the evaluation circuit provides the load state signal such that the load state signal indicates whether the terminal voltage is higher or lower than the half of a no-load voltage of the electric power source.

2. A loading state determiner according to claim 1, wherein the loading state determiner determines an instantaneous load state signal based on a quantity indicating an instantaneous current instantaneously provided to the load, and of the simultaneously applied instantaneous terminal voltage.

3. A loading state determiner according to claim 1, wherein the loading state determiner determines the instantaneous load state signal based on an evaluation of the instantaneous current instantaneously provided to the load and the instantaneous terminal voltage in a single load state.

4. A loading state determiner according to claim 1, wherein the evaluation provides the load state signal such that the load state signal indicates whether the terminal voltage of the electric power source is at least approximately equal to a half of a no-load voltage of the electric power source or differs from a half of the no-load voltage by more than a predetermined tolerance.

5. A loading state determiner according to claim 1, wherein the evaluation circuit provides the load state signal such that the load state signal indicates whether the terminal voltage is higher or lower than a half of a no-load voltage of the electric power source.

6. A loading state determiner according to claim 1, wherein the evaluation circuit compares, the electric quantity indicating the voltage drop at the source impedance of the power source to the electric quantity describing the terminal voltage of the power source, to determine the relation between the terminal voltage of the power source and the no-load voltage of the power source.

7. A loading state determiner according to claim 1, wherein the voltage drop determination circuit provides an auxiliary current proportional to the instantaneous current provided to the load;
  wherein the loading state determiner limits a difference between the instantaneous current provided to the load and an overall current provided by the power source to 10% at the most; and
  wherein the voltage drop determination circuit generates, a voltage describing the voltage drop at the source impedance of the power source based on the auxiliary current and by using a real-valued or complex-valued impedance member whose value is matched to the real-valued or complex-valued source impedance of the power source; and
  wherein the evaluation circuit receives, at a tap of a voltage divider, a voltage proportional to the terminal voltage as the quantity describing the terminal voltage of the power source; and
  wherein the evaluation circuit comprises a comparator or differential amplifier, which receives the voltage indicating the voltage drop at the source impedance of the power source and the voltage applied to the tap of the voltage divider as input voltages.

8. A loading state determiner according to claim 1, wherein the voltage drop determination circuit comprises a load control transistor, which switches or regulates a current flow through the load;
  wherein the voltage drop determination circuit is implemented to bring a mirror transistor corresponding to the load control transistor, to an operating point corresponding to the operating point of the load control transistor; and
  wherein the voltage drop determination circuit determines the quantity describing the voltage drop at the source impedance of the power source based on a current flow through the mirror transistor or based on a current flow proportional to the current flow through the mirror transistor.

9. A loading state determiner according to claim 8, wherein the load control transistor and the mirror transistor are electrically connected such that a control voltage of the load control transistor and the mirror transistor are the same, and
  wherein the voltage drop determination circuit inputs a current into the load path of the mirror transistor by using a first current bank transistor and to regulate the imprinted current such that a load path voltage of the mirror transistor, apart from a regulation inaccuracy, is equal to a load path voltage of the load control transistor; and
  wherein the voltage drop determination circuit provides, by using a second current bank transistor, a current proportional to the current provided by the first current bank transistor and converts the current provided by the second current bank transistor into a voltage indicating the voltage drop at the source impedance of the power source.

10. A load assembly, comprising:
a loading state determiner for determining a loading state of an electric power source comprising a known source impedance, comprising:
a voltage drop determination circuit that provides, an electric quantity describing a voltage drop at the known source impedance of the power source that is proportional to an instantaneous current, based on a detection of the instantaneous current provided under load by the power source to a load; and
an evaluation circuit that acquires, a load state signal indicating an instantaneous relation between the terminal voltage of the power source and a no-load voltage of the power source based on the electric quantity describing the voltage drop at the source impedance of the power source, and an electric quantity proportional to a terminal voltage of the power source or a rectified terminal voltage of the power source,
wherein the evaluation circuit compares the electric quantity describing the voltage drop at the source impedance of the power source to the electric quantity that is proportional to the terminal voltage of the power source or to the rectified terminal voltage of the power source, to determine the relation between the terminal voltage of the power source and the no-load voltage of the power source;
wherein the evaluation circuit provides load state signal such that the load state signal indicates whether the terminal voltage of the electric power source is at least approximately equal to the half of the no-load voltage of the electric power source or differs by more than a predetermined tolerance from the half of the no-load voltage, or
wherein the evaluation circuit provides the load state signal such that the load state signal indicates whether the terminal voltage is higher or lower than the half of a no-load voltage of the electric power source;
an adjustable load circuit and;
a load adjuster;
wherein the voltage drop determination circuit of the loading state determiner detects the instantaneous current provided by the power source to the adjustable load circuit; and
wherein the load adjuster adjusts the load in dependence on the load state signal such that power matching exists between the power source and the adjustable load circuit.

11. A power supply assembly, comprising:
an electric generator, which is acts as electric power source and provides a no-load voltage depending on a drive state, wherein the electric generator comprises a source impedance, such that when connected to a load, a terminal voltage of the electric generator is lower than the no-load voltage; and
a load assembly, comprising:
a loading state determiner for determining a loading state of an electric power source comprising a known source impedance, comprising:
a voltage drop determination circuit, that provides an electric quantity describing a voltage drop at the known source impedance of the power source that is proportional to an instantaneous current, based on a detection of the instantaneous current provided under load by the power source to a load; and an evaluation circuit that acquires, a load state signal indicating an instantaneous relation between the terminal voltage of the power source and a no-load voltage of the power source based on the electric quantity describing the voltage drop at the source impedance of the power source, and an electric quantity proportional to a terminal voltage of the power source or a rectified terminal voltage of the power source, wherein the evaluation circuit compares the electric quantity describing the voltage drop at the source impedance of the power source to the electric quantity that is proportional to the terminal voltage of the power source or to the rectified terminal voltage of the power source, to determine the relation between the terminal voltage of the power source and the no-load voltage of the power source;

wherein the evaluation circuit provides the load state signal such that the load state signal indicates whether the terminal voltage of the electric power source is at least approximately equal to the half of the no-load voltage of the electric power source or differs by more than a predetermined tolerance from the half of the no-load voltage, or wherein the evaluation circuit is implemented to provide the load state signal such that the load state signal indicates whether the terminal voltage is higher or lower than the half of a no-load voltage of the electric power source; and an adjustable load circuit; and a load adjuster;

wherein the voltage drop determination circuit of the loading state determiner detects the instantaneous current provided by the power source to the adjustable load circuit; and wherein the load adjuster adjusts the load in dependence on the load state signal such that power matching exists between the power source and the adjustable load circuit;

wherein the loading state determiner of the load assembly provides, based on a detection of an instantaneous current provided by the electric generator to the adjustable load circuit, the electric quantity describing a voltage drop at a source impedance of the power source, such that the electric quantity describes a voltage drop at a source impedance of the electric generator.

12. A power supply assembly according to claim 11, wherein the electric generator is excited by vibrations or impacts to provide a voltage, such that a time curve of a no-load voltage of the generator is subject to irregular temporal variations.

13. A method for determining a loading state of an electric power source comprising a known source impedance, comprising:

determining a quantity describing a voltage drop at the known source impedance of the power source, based on an instantaneous current provided under load by the power source to a load, such that the quantity describing the voltage drop at the known source impedance is proportional to the instantaneous current; and acquiring a load state signal indicating an instantaneous relation between the terminal voltage of the power source and the no-load voltage of the power source, based on the quantity describing the voltage drop at the known source impedance of the power source and a quantity describing the terminal voltage of the power source, wherein, for determining the relation between the terminal voltage of the power source and the no-load voltage of the power source, the electric quantity describing the voltage drop at the source impedance of the power source is compared to the electric quantity describing the terminal voltage of the power source; and wherein the load state signal indicates whether the terminal voltage of the electric power source is at least approximately equal to a half of a no-load voltage of the electric power source or differs from the half of the no-load voltage by more than a predetermined tolerance, or wherein the load state signal indicates whether the terminal voltage is higher or lower than the half of a no-load voltage of the electric power source.

* * * * *